(12) United States Patent
Cox

(10) Patent No.: US 10,914,641 B2
(45) Date of Patent: Feb. 9, 2021

(54) SMART PARTS WITH INTENTIONAL INTERNAL VOIDS

(71) Applicant: United States of America as represented by the Secretary of the Navy, San Diego, CA (US)

(72) Inventor: Stephen Charles Cox, San Marcos, CA (US)

(73) Assignee: United States of America as Represented by the Secretary of the Navy, Washington, DC (US)

( * ) Notice: Subject to any disclaimer, the term of this patent is extended or adjusted under 35 U.S.C. 154(b) by 174 days.

(21) Appl. No.: 16/128,649

(22) Filed: Sep. 12, 2018

(65) Prior Publication Data

US 2019/0344554 A1 Nov. 14, 2019

Related U.S. Application Data

(60) Provisional application No. 62/669,791, filed on May 10, 2018.

(51) Int. Cl.
| | |
|---|---|
| *G01K 1/14* | (2006.01) |
| *G01K 1/024* | (2021.01) |
| *B33Y 80/00* | (2015.01) |
| *G01B 7/16* | (2006.01) |
| *B33Y 10/00* | (2015.01) |
| *B29C 64/379* | (2017.01) |
| *G06F 30/20* | (2020.01) |

(52) U.S. Cl.
CPC .............. *G01K 1/14* (2013.01); *B29C 64/379* (2017.08); *B33Y 10/00* (2014.12); *B33Y 80/00* (2014.12); *G01B 7/20* (2013.01); *G01K 1/024* (2013.01); *G06F 30/20* (2020.01); *G01B 2210/58* (2013.01)

(58) Field of Classification Search
USPC ......................................................... 235/435
See application file for complete search history.

(56) References Cited

U.S. PATENT DOCUMENTS

| | | | | |
|---|---|---|---|---|
| 2008/0095490 A1* | 4/2008 | Ashkenazi | ............. | G01H 9/004 385/13 |
| 2009/0067151 A1* | 3/2009 | Sahlin | .................. | G02B 6/0065 362/23.03 |

(Continued)

OTHER PUBLICATIONS

Yuanyuan Xu, Xiaoyue Wu, Xiao Guo, Bin Kong, Min Zhang, Xiang Qian, Shengli Mi, and Wei Sun; The Boom in 3D-Printed Sensor Technology; Sensors, 17, 1166; 2017.

(Continued)

*Primary Examiner* — Rafferty D Kelly
(74) *Attorney, Agent, or Firm* — Naval Information Warfare Center, Pacific; Kyle Eppele; James Eric Anderson

(57) ABSTRACT

A smart part comprising: a body, manufactured by a three-dimensional (3D) additive manufacturing (AM) process, having high-stress and low-stress sections, wherein when the smart part is in operational use the high-stress section is subjected to higher stress than the low-stress section; and wherein the body comprises a void having a predefined geometry intentionally created within the high-stress section of the body during the AM process, such that the void is completely embedded within the body and is configured to provide quality assurance information.

5 Claims, 8 Drawing Sheets

(56) References Cited

U.S. PATENT DOCUMENTS

2015/0250420 A1* 9/2015 Longinotti-Buitoni ............... G01L 1/22
600/301
2016/0356866 A1 12/2016 Attridge

OTHER PUBLICATIONS

Tsai et al.; Additive manufacturing of Smart Parts with Embedded Sensors for In-Situ monitoring in Advanced Energy Systems; METL Crosscutting Technology Research Review Meeting, Pittsburgh, PA, 2017.

Leigh et al.; A Simple, Low-Cost Conductive Composite Material for 3D Printing of Electronic Sensors; PLoS ONE 7(11): e49365. doi:10.1371/journal.pone.0049365; Editor: Jeongmin Hong, Florida International University, United States; 2012.

Lehmhus et al.; Customized Smartness: A Survey on links between Additive Manufacturing and Sensor Integration; 3rd International Conference on System-integrated Intelligence: New Challenges for Product and Production Engineering, SysInt 2016.

Waterman, Pamela J.; 3D-Printed Electronics Charge Ahead; Digital Engineering, available online at http://www.digitaleng.news/de/3d-printed-electronics-charge-ahead/; 2016.

Albakri et al.; Non-Destructive Evaluation of Additively Manufactured Parts Via Impedance-Based Monitoring; Rapid Prototyping Journal, vol. 23 Issue: 3, pp. 589-601, https://doi.org/10.1108/RPJ-03-2016-0046; 2017.

Attridge et al.; Additively Manufactured IN718 Components with Wirelessly Powered and Interrogated Embedded Sensing; United States: N. p.,. Web. doi:10.2172/1369567. 2017.

Boersch, Jens; Temperature compensation o2016f strain gauges; webinar; HBM public.

Wei, Li-Ju; The Fabrication of Integrated Strain Sensors for "Smart" Implants using a Direct Write Additive Manufacturing Approach; PhD thesis; De Montfort University Leicester UK; 2014.

Taubenrauch et al.; Printed strain gauges for aircraft load detection using Aerosol Jet® printing; Aerosol Jet® User Group Meeting Sep. 11 to 13, 2011.

Gooding et al; 3D Printed Strain Gauge Geometry and Orientation for Embedded Sensing; Conference Paper—Jan. 2017.

* cited by examiner

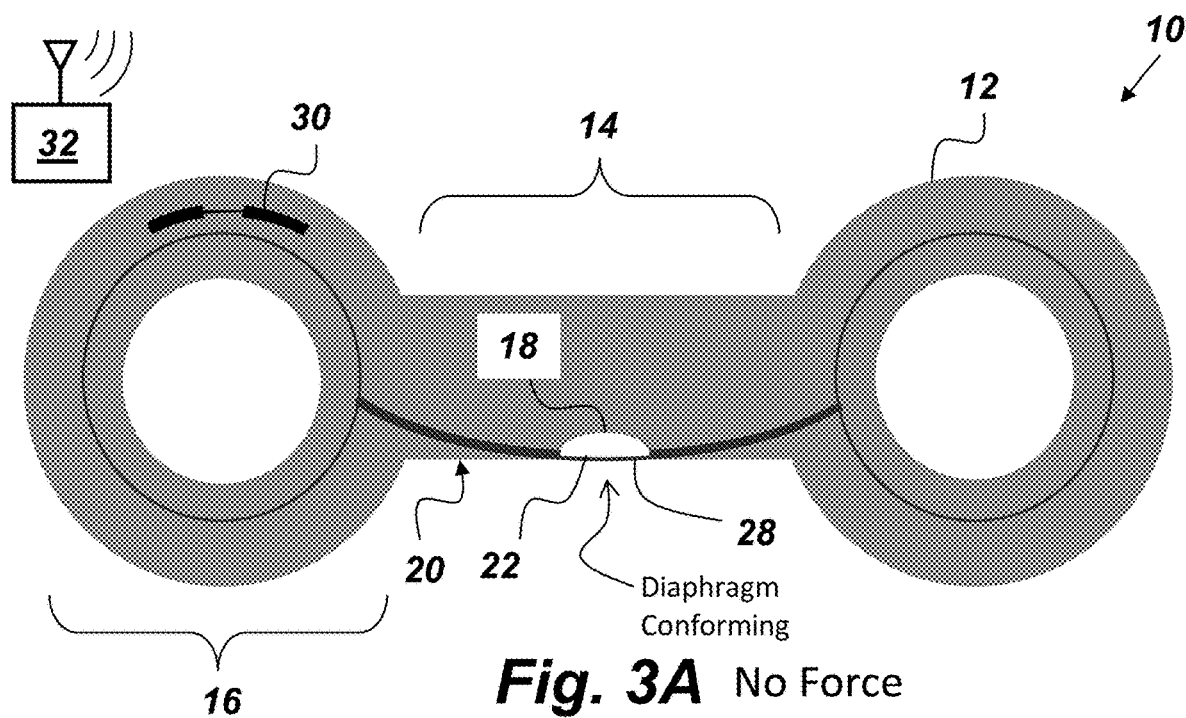
Fig. 3A No Force
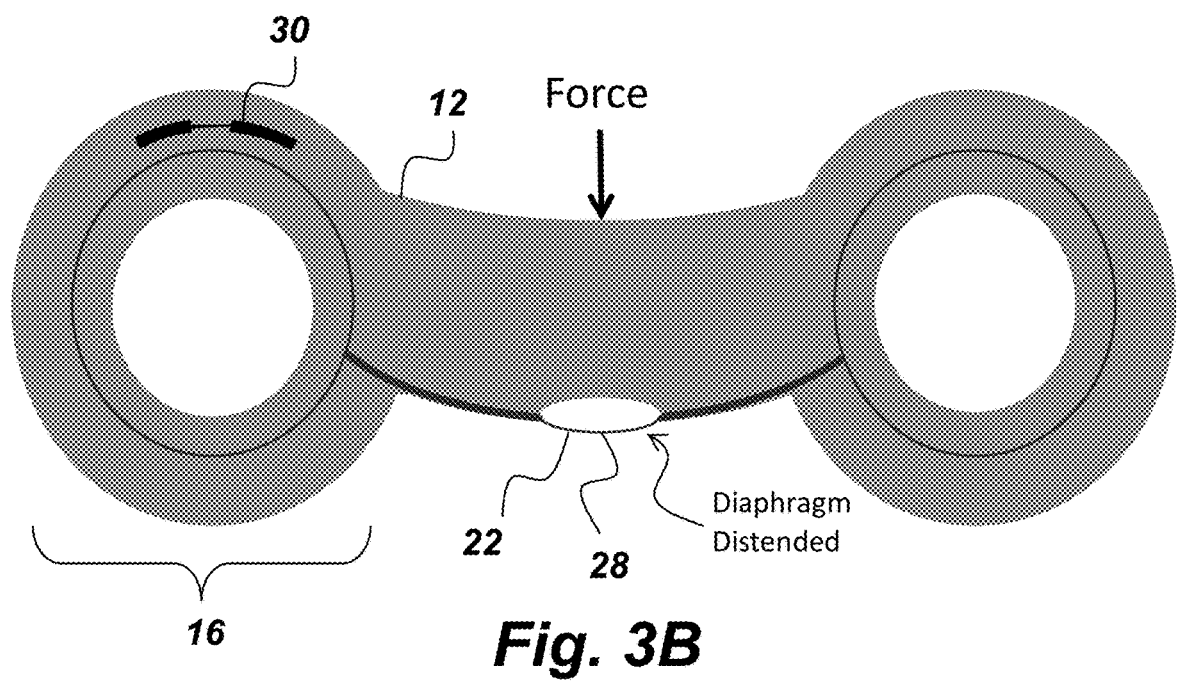
Fig. 3B

Fig. 5  No Force

SMART PARTS WITH INTENTIONAL INTERNAL VOIDS

CROSS-REFERENCE TO RELATED APPLICATION

This application claims the benefit of U.S. Provisional Application No.: 62/669,791, filed 10 May 2018, titled "Smart Parts: Embedded Sensors for Use in Additive Manufactured Parts" (Navy Case #104160), which is incorporated by reference herein in its entirety.

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 109160.

BACKGROUND OF THE INVENTION

The uses for three-dimensional (3D) additive manufactured (AM) parts continues to explode and is creating a certification problem, not only for the computer models which can be simulated, but for individual parts, made from different stock lots, at different times, by different manufactures, stored under varying conditions and realized on different 3D Printers and other additive manufacturing hardware. There is a need for a way to non-destructively test and/or certify 3D AM parts.

SUMMARY

Disclosed herein is a smart part comprising: a body, manufactured by a 3D AM process, having high-stress and low-stress sections. When the smart part is in operational use the high-stress section is subjected to higher stress than the low-stress section. The body comprises a void having a predefined geometry intentionally created within the high-stress section of the body during the AM process. The void is completely embedded within the body and is configured to provide quality assurance information.

The smart part 10 disclosed herein may be used to obtain quality assurance information of the smart part comprising the following steps. The first step provides for manufacturing a body of the smart part with a 3D AM process. The next step provides for creating an embedded, intentional void having a predefined geometry within the body of the smart part during the AM process. The next step provided for applying energy to the smart part. The next step provides for measuring a response of the smart part to the applied energy with an external monitoring device. The next step provides for detecting defects in the smart part by comparing the smart part's response to the applied energy to an expected response based on the geometry of the intentional void.

BRIEF DESCRIPTION OF THE DRAWINGS

Throughout the several views, like elements are referenced using like references. The elements in the figures are not drawn to scale and some dimensions are exaggerated for clarity.

FIGS. 3A and 3B are cross-sectional, side-view illustrations of a mechanical linkage embodiment of a smart part.

DETAILED DESCRIPTION OF EMBODIMENTS

The disclosed apparatus and method below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
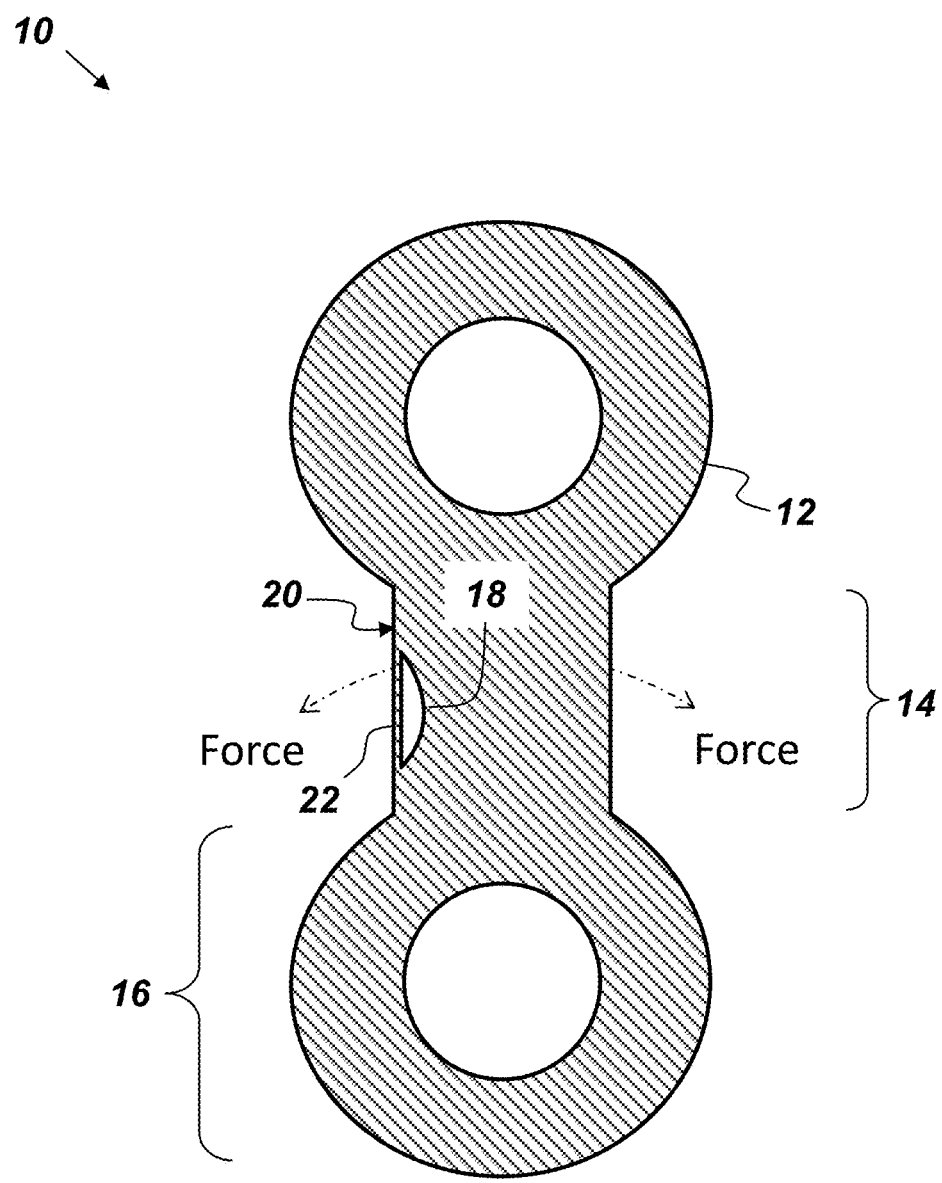
FIG. 1 is a cross-sectional, side-view illustration of an embodiment of a smart part.

FIG. 1 is a cross-sectional, side-view illustration of a mechanical linkage embodiment of a smart part 10 that comprises, consists of, or consists essentially of a body 12 that is manufactured by a 3D AM process. The body 12 has a high-stress section 14 and low-stress section 16. When the smart part 10 is in operational use the high-stress section 14 is subjected to higher stress than the low-stress section 16. The body 12 comprises a void 18 having a predefined geometry. The void 18 is intentionally created within the high-stress section 14 of the body 12 during the AM process. The void 18 is completely embedded within the body 12 and is configured to provide quality assurance information. There are many ways in which the intentional void 18 may be used to provide quality assurance information. For example, in one example embodiment of the smart part 10, the void may be created near a surface 20 of the body 12 such that a segment of the body 12 between the void 12 and the surface 20 forms a flexible diaphragm 22 such as is shown in FIG. 1. The flexible diaphragm may be designed to have a large enough tolerance of movement such that when the diaphragm is subjected to a force exceeding a threshold value the diaphragm 22 distends emitting an audible "pop" that serves as an indication of the smart part's condition. Thus, if an operator or user hears the "pop" he or she will know that the smart part 10 has been subjected to a force that exceeds the threshold.

Figure 2:
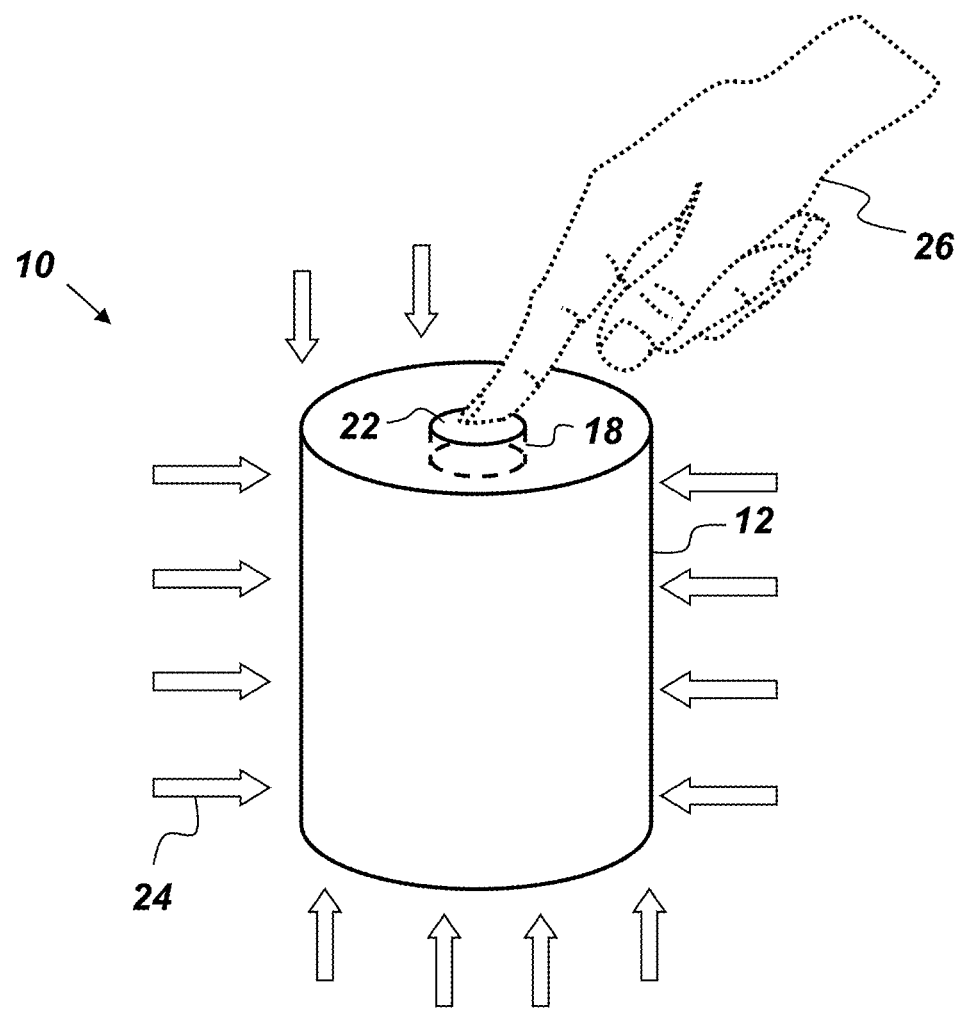
FIG. 2 is a perspective illustration of an example embodiment of a smart part.

FIG. 2 is a perspective illustration of another example embodiment of the smart part 10 where the smart part 10 has a cylindrical body 12 and cylindrical void 18 located near an end of the body. In this embodiment (i.e., the one depicted in FIG. 2), The smart part 10 is exposed to a specific environmental pressure 24 and the diaphragm 22 is configured to "pop" when being momentarily depressed by an operator 26 during a quality test to determine if the smart part 10 is still serviceable, which is indicated if the diaphragm 22 "pops" back after the momentary depression.

FIGS. 3A and 3B are cross-sectional, side-view illustrations of a mechanical linkage embodiment of the smart part 10 that comprises a resistive strain gauge 28 printed in conductive ink within the body 12 during the AM process. The strain gauge 28 is printed within the high-stress section 14 such that the strain gauge 28 spans the void 18. FIG. 3A shows the smart part 10 in a condition where no force is being applied to the high-stress section 14. Under the no-force condition shown in FIG. 3A, the diaphragm 22 conforms to the body surface 20 and the printed conductive ink element remains undistorted. The small void 18 beneath the strain gauge 28 allows diaphragm 22 to move based on force applied to the smart part 10. In this embodiment of the smart part 10 (i.e., the embodiment shown in FIGS. 3A and 3B), the strain gauge 28 is configured to produce a variable output as the resistance across the strain gauge 28 changes as the body 12 is subjected to forces causing the conductive ink of the strain gauge 28 thin relative to the amount of force applied to the body 12. FIG. 3B shows the smart part 10 under a force condition where the smart part 10 is subjected to a force which causes the body 12 to deform. When a threshold is met, the diaphragm 22 "pops" and distends, putting strain on the strain gauge 28 and causing elongation and thinning, which may be read as a change in resistance by a circuit path across the body 12.

FIGS. 3A and 3B also show an optional temperature sensor 30 that was embedded within the body 12 during the AM process at the low-stress section 16. The temperature sensor 30 is configured to produce a variable output based on temperature. The temperature sensor 30 may be fabricated with conductive ink in the same way as the strain gauge 28. Increased temperature in the low-stress section 16 is read as increased resistance by the temperature sensor 30, due to positive temperature conduction coefficient of most conductive inks used in 3DAM. Suitable examples of conductive ink include, but are not limited to, carbon, copper, and silver bases. An off-structure recording, monitoring, and/or control system, such as the external monitoring device 32 shown in FIG. 3A may be used to perform mathematics "dividing out" temperature differences and maintaining correct scale and amplitude information from the strain gauge 28. Both of the strain gauge 28 and the temperature sensor 30 may be connected to contacts on the low-stress section 16 of the body 12 to be read by the external monitoring device 32 either by direct connection or wirelessly without external contacts.

Figure 4:
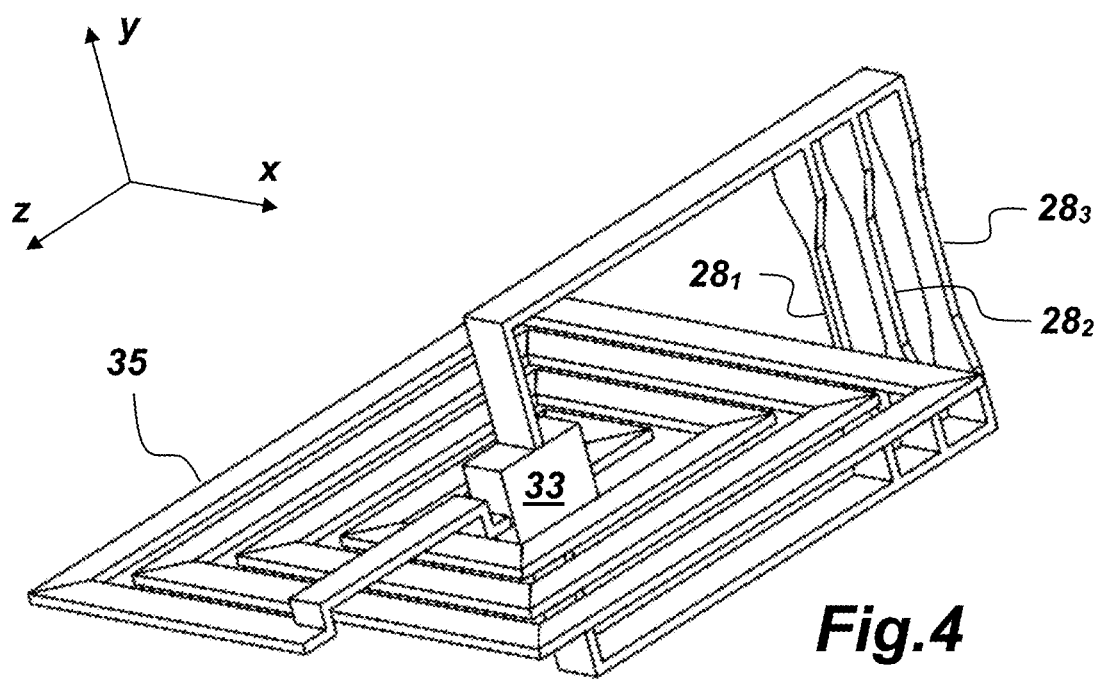
FIG. 4 is a perspective view illustration of an embodiment of an RFID transponder that is electrically connected to an antenna coil and a plurality of resistive strain gauge sensors.

It may be desirable for some embodiments of the smart part 10 to include both an embedded radio frequency identification (RFID) transponder 33 and conductive traces leading from embedded sensors (such as the strain gauge 28 and the temperature sensor 30) to the exterior surface 20 of the body 12. FIG. 4 is a perspective view illustration of an embodiment of the RFID transponder 33 that is electrically connected to an antenna coil 35 and a plurality of resistive strain gauge sensors $28_1$-$28_n$. The RFID transponder 33 may be any powered or passive RFID circuit. Typical RFID transponders comprise an antenna and a microprocessor designed to incorporate the functions of a central processing unit (CPU) onto a single semiconducting integrated circuit (IC), as is known in the art. The RFID transponder's antenna is the conductive element that enables the transponder to send and receive data. Passive, low- (135 kHz) and high-frequency (13.56 MHz) tags or transponders usually have a coiled antenna that couples with the coiled antenna of a reader, such as the external monitoring device 32, to form a magnetic field. A passive RFID transponder does not come with its own power source and transmitter. When radio frequency (RF) waves from a reader (such as the external monitoring device 32) reach the passive RFID transponder's antenna (such as the antenna coil 35), the energy is converted by the RFID transponder's antenna into electricity that can provide power to the microprocessor. The RFID transponder is able to send information stored on the microprocessor back to the external monitoring device 32. A suitable example of the passive RFID transponder 33 includes, but is not limited to, an ultra-high frequency (UHF) 860-960 MHz Web RFID tag.

The external monitoring device 32 may be any hand-held instrument which can read data from the strain gauge 28 and the temperature sensor 30. The external monitoring device 32 comprises an antenna which can be used to emit radio waves. The RF energy from the antenna is "harvested" by the passive RFID's antenna and used to power the RFID's microprocessor, which then changes the electrical load on the RFID's antenna to reflect back its own signals. In other words, the external monitoring device 32 sends out an RF "pulse", stimulating the embedded sensors (temp/strain) within the body 12 with the RFID transponder. The energy from the pulse is collected, by the RFID's antenna, rectified by the RFID's transponder, and becomes direct current (DC), which is then used to power the embedded sensors of the smart part 10. Once powered, the embedded RFID transponder then transmits the data as read from the temperature sensor 30 and the strain gauge 28. The cycle may repeat at fractions of a second to provide real-time continuous readout of data regarding the smart part 10 while in operation and in communication with the external monitoring device 32 without having to disconnect or dismantle the smart part 10.

Figure 5:
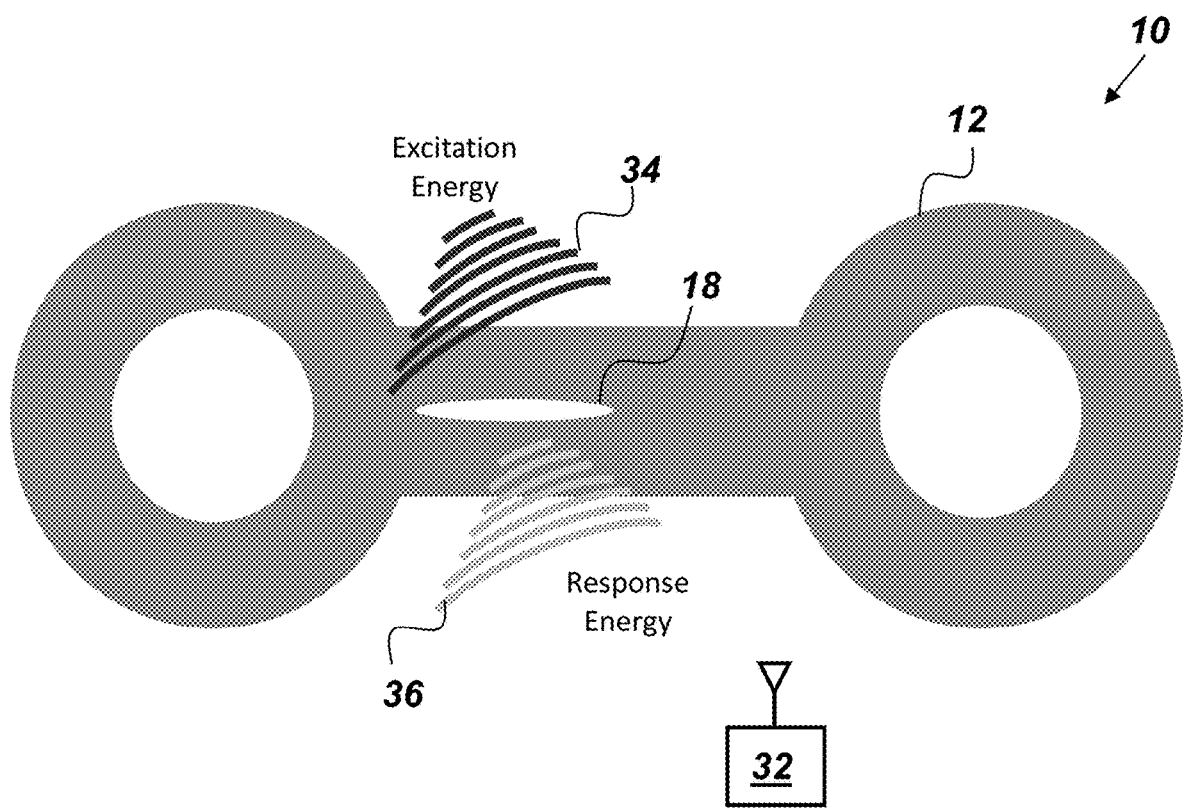
FIG. 5 is a side-view, cross-sectional illustration of an embodiment of a smart part.

FIG. 5 is a side-view, cross-sectional illustration of an embodiment of the smart part 10 there the body 12 is made of a material that is sufficiently dense to RF energy such that when the smart part 10 is exposed to an RF field, such as the excitation energy 34 shown in FIG. 5, the void 18 behaves as a resonance cavity emitting a response 36 that may be monitored by the external monitoring device 32. Externally, AM parts are fairly easy to inspect. The smart part 10 allows for non-destructive inspection of the interior of the body 12. For example, in the example embodiment of the smart part 10 depicted in FIG. 5, when the body 12 is not be subjected to externally-applied force, the intentional, internal void 18 may be excited by an ultrasonic signal generated by the external monitoring device 32. Once excited by the excitation energy 34, the void 18 begins to resonate or "ring". The response may be predicted and characterized based on the shape of the intentional void 18 and parameters of the smart part 10. Defects, such as other voids, density, or geometry errors of the manufacturing process show up as deviations from the predicted resonance response and indicate that the smart part 10 is not serviceable and by relatively how far out of specification. This concept shows intentional voids 18 may be used as a quality control mechanism. Required instrumentation, such as the external monitoring device 32, may be realized as handheld and highly portable.

Embodiments of the smart part 10 may also be employed where the internal void 18 is designed as a resonance cavity that is configured to resonate when excited by body vibrations that exceed a threshold value. The resonating cavity may be detected either audibly by a user or with the external monitoring device and would serve as a real-time indication of the level of vibration experienced by the smart part 10.

In another embodiment of the smart part 10, the body is made of a material that is transparent to RF energy. In such an embodiment, the void 18 may be used as a resonance cavity for ultrasonic energy. For example, the external monitoring device 32 may be configured to produce the excitation energy 34, which in this case is ultrasonic energy, and to record the response 36 from the smart part 10.

Figure 6:
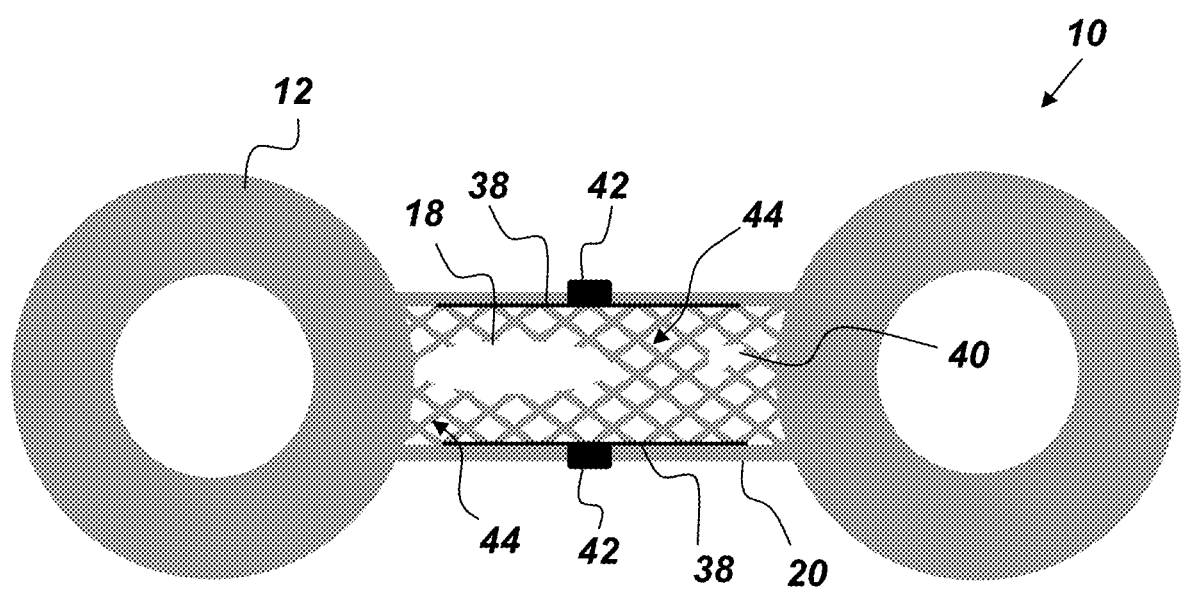
FIG. 6 is a cross-sectional, side-view illustration of an embodiment of a smart part.

FIG. 6 is a cross-sectional, side-view illustration of an embodiment of the smart part 10 that comprises two planar structures 38 printed in conductive ink during the AM process within or on the body 12 such that the void 18 is disposed between the planar structures 38. Electrical contacts 42 that extend beyond the surface 20 may be attached to the planar structures 38 such that capacitive measurements may be taken between the planar structures 38. An unintentional void or defect 40 may be found, or an intentional void 18 may be confirmed, by measuring the capacitance between the two planar structures 38. A capacitive measurement may be made between planar structures 38 comprising conductive ink printed on both sides of "webbing" surfaces 44 of the body 12 (rather than the compression or tension members of the smart part 10, which is where strain sensors (e.g., strain gauge 28) and information may be taken). In other words, the planar structures 38 and/or the strain gauge 28 may optionally be printed on webbing surfaces 44. Changes in dielectric strength change capacitance and so part material would have a greater dielectric constant than air in a void, and may be read by a handheld, conventional, commercial, off-the-shelf (COTS) capacitance meter. Electrical contacts 42 may be positioned for easy access after installation or while in operation.

The strain gauge 28 may also be printed on webbing that is spirally wrapped around a cylindrical section of the smart part 10, or "sparse fill" webbing which is closer to what is depicted in FIG. 6, in which a network of single fibers spans a section of the body 12, end-to-end, and each fiber is its own strain gauge 38. The sparse fill webbing would be good for a go/no-go indication while a wrapped webbing would be better applied to a continuous range of readings. The "fiber" used for the strain gauge 38 may be a continuous carbon fiber placed in the polymer matrix. Such an embodiment may be produced with a two-head 3D printer; one head for a Nylon binder and one head for the continuous carbon fiber, which is conductive, though relatively high is resistance (megohms/inch). New materials may use copper "in-situ" with the carbon for lower resistance and greater range of applications.

Figure 7A:
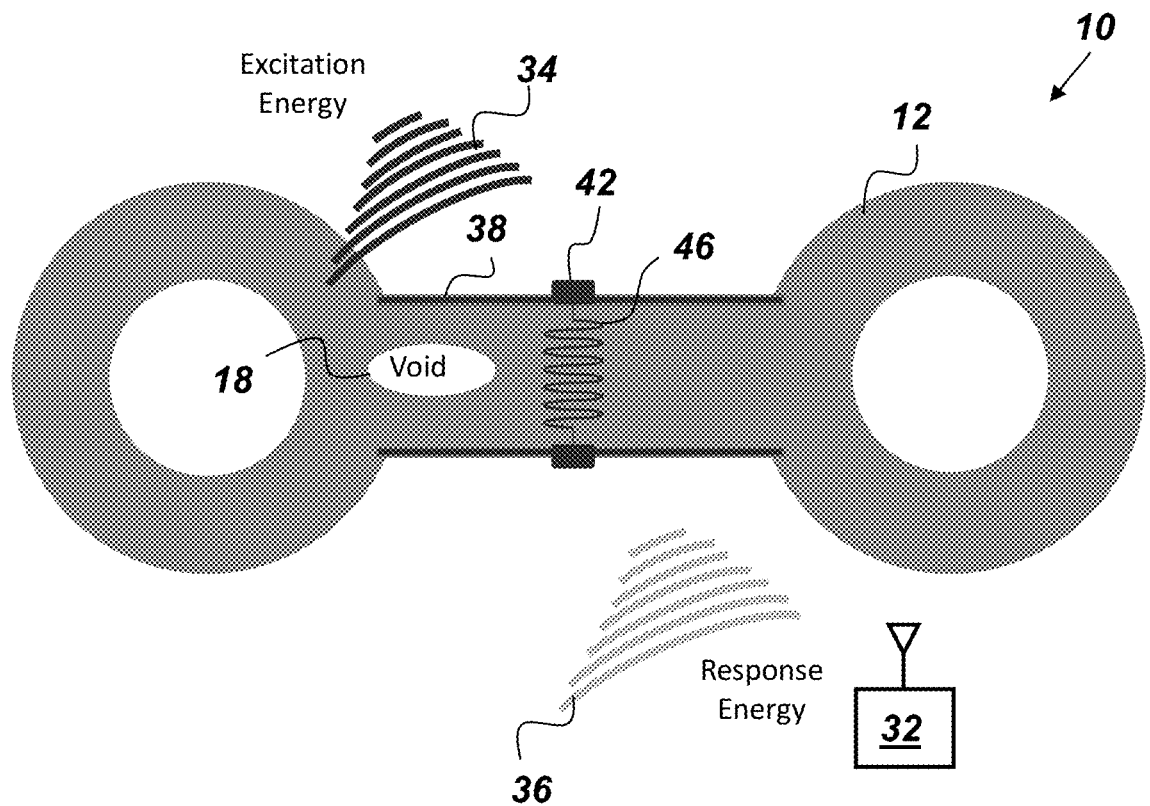
FIG. 7A is a cross-sectional, side-view illustration of an embodiment of a smart part.
Figure 7B:
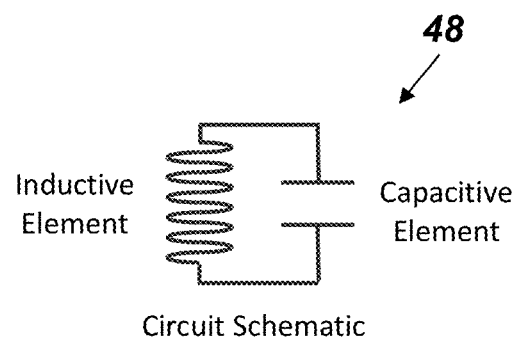
FIG. 7B is an example circuit diagram for a resonant circuit.

FIG. 7A is a cross-sectional, side-view illustration of an embodiment of the smart part 10 that comprises an inductive element 46 printed in conductive ink during the AM process. The inductive element 46 is electrically connected between the two planar structures 38 to form a resonant circuit 48, which is depicted schematically in FIG. 7B. In the embodiment of the smart part 10 depicted in FIG. 7A, electrical contacts 42 are disposed on a surface 20 of the body and electrically connected to the planar structures 38 to enable direct measurement of the resonant circuit. Optionally, the embedded resonant circuit may be read using a non-contact measurement meter, such as the external monitoring device 32, by transmitting a broad range of frequencies and reading the response of the smart part 10, which if correctly manufactured, will be a single, intentional, specified frequency based on the geometry of the inductive and capacitive elements 46 and 38 respectively.

Figure 8:
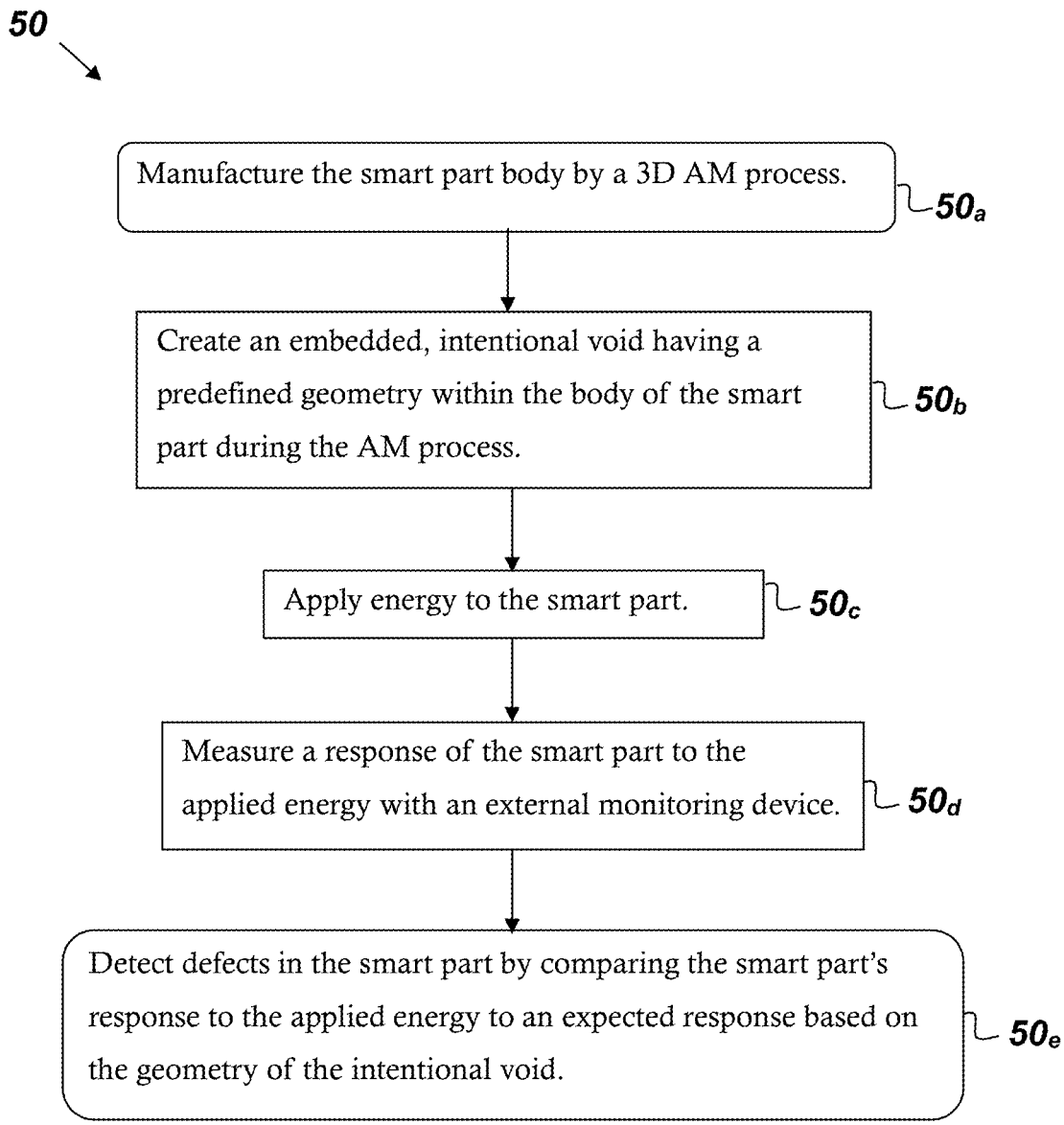
FIG. 8 is a flowchart of a method for obtaining quality assurance information of a smart part.

FIG. 8 is a flowchart of a method 50 for obtaining quality assurance information of a smart part comprising the following steps. The first step $50_a$ provides for manufacturing a body of the smart part with a 3D AM process. The next step $50_b$ provides for creating an embedded, intentional void having a predefined geometry within the body of the smart part during the AM process. The next step $50_c$ provides for applying energy to the smart part. The next step $50_d$ provides for measuring a response of the smart part to the applied energy with an external monitoring device. The next step $50_e$ provides for detecting defects in the smart part by comparing the smart part's response to the applied energy to an expected response based on the geometry of the intentional void.

In addition to embodiments discussed above, the intentional void 18 may also be used to create a peristaltic tube within the body 12 of the smart part 10, which may be used to indicate physical conditions of the smart part 10 as an indicator as to whether or not physical requirements or conditions for the part have been met. Embodiments of the smart part 10 may be used to exploit at least, either alone or in combination, capacitance, RF permeability, RF resonance, and piezo electric changes across the body 10 realized as embedded structures. Thus, the smart part 10 may be tested after manufacture, at installation, and at inspection operations, with and without external instrumentation (such as the external monitoring device 32), depending on the embodiment. The external monitoring device 32 may be realized from existing COTS ultrasonic and/or RF testing hardware and transducers and may be hand held, inexpensive and portable, making factory-to-field testing practical.

The smart part 10 may be used to verify the individual part's performance, failure points, wear and useful life. In addition, dynamic, "real-time" information may be obtained from the smart part 10, which may be used to operate the systems of which the smart part 10 is a component, to meet a specific objective. This is particularly important in aerospace and military applications. Sensors and their circuit connections may be printed at the same time, (or nearly the same time if process requires a tooling or machine change) or in the same operation as the AM structural fabrication process. Machines that incorporate smart parts 10 give an operator the option of running the machine hard, knowing that failure is imminent to complete a critical goal, idling the machine while maintaining minimum capability until a repair or replacement is available, justifying shut down, machine asset replacement, and real-time statistical process control; knowing exactly when a machine will go off-line, what is wrong, cost, and time to repair and restore. Great risk exists if an ill-intentioned party were able to alter a 3D-printed-part file with a hidden failure, such as printing the part with a void or hollow space significantly weakening the part. The smart part 10 overcomes these problems as the part has integral testing and if the file is altered it is unlikely the integral sensors could be correctly printed while the part is incorrectly printed. If the sensor is correct, it will show the failure in the part, if the sensor does not report, and investigation will show that the file was altered either to introduce a failure into the part or the sensor, either of which shows malevolent intent, allows a mechanism to reject the part protecting the target machine, and trace the source of potential malicious code. This then provides integral security for the part file and process for 3DAM parts.

From the above description of the smart part 10, it is manifest that various techniques may be used for implementing the concepts of smart part 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that smart part 10 is not limited to the particular embodiments described herein, but is capable of many embodiments without departing from the scope of the claims.

I claim:

1. A smart part comprising:
a body, manufactured by a three-dimensional (3D) additive manufacturing (AM) process, having high-stress and low-stress sections, wherein when the smart part is in operational use the high-stress section is subjected to higher stress than the low-stress section;
wherein the body comprises a void having a predefined geometry intentionally created within the high-stress section of the body during the AM process, such that the void is completely embedded within the body and is configured to provide quality assurance information;
wherein the void is created near a surface of the body such that a segment of the body between the void and the surface forms a flexible diaphragm; and
further comprising a resistive strain gauge printed in conductive ink within the body during the AM process at the high-stress section such that the resistive strain gauge spans the void, wherein the strain gauge is configured to produce a variable output.

2. The smart part of claim 1, further comprising a temperature sensor embedded within the body during the AM process at the low-stress section, wherein the temperature sensor is configured to produce a variable output based on temperature.

3. The smart part of claim 2, further comprising a passive radio frequency identification (RFID) transponder embedded within the body, wherein the RFID transponder is communicatively coupled to the temperature sensor and the strain gauge, and configured to harvest incoming RF energy and to transmit data representative of the variable outputs of the strain gauge and the temperature sensor.

4. A smart part comprising:
a body, manufactured by a three-dimensional (3D) additive manufacturing (AM) process, having high-stress and low-stress sections, wherein when the smart part is in operational use the high-stress section is subjected to higher stress than the low-stress section;
wherein the body comprises a void having a predefined geometry intentionally created within the high-stress section of the body during the AM process, such that the void is completely embedded within the body and is configured to provide quality assurance information;
further comprising two planar structures printed in conductive ink during the AM process within or on the body such that the void is disposed between the planar structures, such that capacitive measurements may be taken between the planar structures; and
further comprising an inductive element printed in conductive ink during the AM process, wherein the inductive element is electrically connected between the two planar structures to form a resonant circuit.

5. The smart part of claim 4, further comprising electrical contacts disposed on a surface of the body and electrically connected to the planar structures to enable direct measurement of the resonant circuit.

* * * * *